US012218479B2

United States Patent
Lee et al.

(10) Patent No.: US 12,218,479 B2
(45) Date of Patent: Feb. 4, 2025

(54) PHOTONIC INTEGRATED CIRCUITS WITH CONTROLLED COLLAPSE CHIP CONNECTIONS

(71) Applicant: Apple Inc., Cupertino, CA (US)

(72) Inventors: SeungJae Lee, Pasadena, CA (US); Brett Sawyer, Pasadena, CA (US); Chia-Te Chou, Brea, CA (US); Jerry Byrd, Shadow Hills, CA (US); Hooman Abediasl, Thousand Oaks, CA (US)

(*) Notice: Subject to any disclaimer, the term of this patent is extended or adjusted under 35 U.S.C. 154(b) by 567 days.

(21) Appl. No.: 17/379,759

(22) Filed: Jul. 19, 2021

(65) Prior Publication Data

US 2022/0021179 A1    Jan. 20, 2022

Related U.S. Application Data

(60) Provisional application No. 63/053,841, filed on Jul. 20, 2020.

(51) Int. Cl.
*H01S 5/0225*    (2021.01)
*H01S 5/02*      (2006.01)
*H01S 5/0239*    (2021.01)

(52) U.S. Cl.
CPC ............ *H01S 5/0225* (2021.01); *H01S 5/021* (2013.01); *H01S 5/0239* (2021.01)

(58) Field of Classification Search
CPC ..... H01S 5/023–02326; H01S 5/02315; H01S 5/02325
See application file for complete search history.

(56) References Cited

U.S. PATENT DOCUMENTS 4,897,711 A * 1/1990 Blonder .............. G02B 6/4214
                                                    257/729
5,037,779 A * 8/1991 Whalley .............. G01N 27/414
                                                    257/253
(Continued)

FOREIGN PATENT DOCUMENTS

CN    206546453 U  * 10/2017   ............... G02B 6/13
DE    102004025775 A1 * 4/2005  ......... H01S 5/02288
(Continued)

OTHER PUBLICATIONS

International Search Report and Written Opinion dated Nov. 10, 2021, PCT/US2021/042226, 11 pages.
(Continued)

*Primary Examiner* — Joshua King
(74) *Attorney, Agent, or Firm* — Brownstein Hyatt Farber Schreck, LLP

(57) ABSTRACT

Embodiments are directed to a photonic device that includes a first substrate defining a surface and a trench forming a depression along a portion of the surface, and a second substrate coupled with the surface and extending from the surface to form a raised portion around the trench. The photonic device can also include a laser die positioned within the trench, such that the laser die is surrounded by the second substrate, and an optical material positioned within a region between the laser die and the second substrate. The photonic device can further include a third substrate coupled with the second substrate such that the second substrate is positioned between the first substrate and the third substrate such that the second substrate is configured to at least partially isolate the laser die from mechanical stress exerted on the optical device.

8 Claims, 7 Drawing Sheets

(56) References Cited

U.S. PATENT DOCUMENTS

| | | | |
|---|---|---|---|
| 5,109,455 A * | 4/1992 | Niswonger | G02B 6/4257 385/94 |
| 5,287,376 A | 2/1994 | Paoli | |
| 5,479,540 A * | 12/1995 | Boudreau | G02B 6/4231 398/164 |
| 5,488,678 A | 1/1996 | Taneya | |
| 5,577,142 A * | 11/1996 | Mueller-Fiedler | G02B 6/4214 385/47 |
| 5,604,160 A * | 2/1997 | Warfield | G01P 15/0802 438/977 |
| 5,644,667 A | 7/1997 | Tabuchi | |
| 5,708,674 A | 1/1998 | Berrnink | |
| 5,742,631 A | 4/1998 | Paoli | |
| 5,850,411 A | 12/1998 | Major, Jr. | |
| 5,915,165 A | 6/1999 | Sun | |
| 5,981,945 A * | 11/1999 | Spaeth | G02B 6/4204 257/E31.127 |
| 6,074,104 A * | 6/2000 | Higashikawa | G02B 6/4248 385/94 |
| 6,122,042 A | 9/2000 | Wunderman et al. | |
| 6,228,675 B1 * | 5/2001 | Ruby | H01L 24/05 438/106 |
| 6,330,378 B1 | 12/2001 | Forrest | |
| 6,367,988 B1 * | 4/2002 | Auracher | G02B 6/30 385/94 |
| 6,393,185 B1 | 5/2002 | Deacon | |
| 6,461,059 B2 | 10/2002 | Ando et al. | |
| 6,465,929 B1 | 10/2002 | Levitan et al. | |
| 6,519,382 B1 | 2/2003 | Jurbergs | |
| 6,588,949 B1 * | 7/2003 | Zhou | H01S 5/02253 385/94 |
| 6,594,409 B2 | 7/2003 | Dutt et al. | |
| 6,628,686 B1 | 9/2003 | Sargent | |
| 6,628,858 B2 | 9/2003 | Zhang | |
| 6,632,027 B1 * | 10/2003 | Yoshida | G02B 6/4202 385/94 |
| 6,657,723 B2 | 12/2003 | Cohen | |
| 6,753,197 B2 * | 6/2004 | Dudoff | H01L 25/167 257/E25.032 |
| 6,759,687 B1 * | 7/2004 | Miller | H01L 33/58 257/432 |
| 6,767,753 B2 * | 7/2004 | Huang | H01L 24/97 257/680 |
| 6,795,622 B2 | 9/2004 | Forrest | |
| 6,801,679 B2 | 10/2004 | Koh | |
| 6,801,683 B2 | 10/2004 | Kanie et al. | |
| 6,803,604 B2 | 10/2004 | Takahashi et al. | |
| 6,823,098 B2 | 11/2004 | Guidotti et al. | |
| 6,873,763 B2 | 3/2005 | Nikonov | |
| 6,892,449 B1 | 5/2005 | Brophy et al. | |
| 6,894,358 B2 * | 5/2005 | Leib | B81C 1/00301 438/22 |
| 6,898,222 B2 | 5/2005 | Hennig et al. | |
| 6,904,191 B2 | 6/2005 | Kubby | |
| 6,932,519 B2 * | 8/2005 | Steinberg | G02B 6/4245 385/88 |
| 6,935,792 B2 | 8/2005 | Saia et al. | |
| 6,940,182 B2 | 9/2005 | Hilton et al. | |
| 6,947,639 B2 | 9/2005 | Singh | |
| 6,952,504 B2 | 10/2005 | Bi | |
| 6,955,481 B2 | 10/2005 | Colgan et al. | |
| 6,969,204 B2 * | 11/2005 | Kilian | G02B 6/4214 385/94 |
| 6,975,465 B1 | 12/2005 | Chung | |
| 6,987,906 B2 | 1/2006 | Nakama et al. | |
| 7,054,517 B2 | 5/2006 | Mossberg | |
| 7,058,245 B2 | 6/2006 | Farahi | |
| 7,062,114 B2 | 6/2006 | Webjorn | |
| 7,079,715 B2 | 7/2006 | Kish | |
| 7,085,445 B2 | 8/2006 | Koh | |
| 7,189,011 B2 | 3/2007 | Harker | |
| 7,203,401 B2 | 4/2007 | Mossberg | |
| 7,203,426 B2 | 4/2007 | Wu et al. | |
| 7,209,611 B2 | 4/2007 | Joyner | |
| 7,213,978 B2 * | 5/2007 | Kuhmann | G02B 6/423 385/52 |
| 7,223,619 B2 * | 5/2007 | Wang | H01S 5/423 257/E33.072 |
| 7,245,379 B2 | 7/2007 | Schwabe | |
| 7,262,622 B2 * | 8/2007 | Zhao | H01L 23/10 257/E23.193 |
| 7,283,694 B2 | 10/2007 | Welch | |
| 7,314,451 B2 | 1/2008 | Halperin et al. | |
| 7,315,039 B2 | 1/2008 | Kitagawa | |
| 7,324,195 B2 | 1/2008 | Packirisamy et al. | |
| 7,335,986 B1 * | 2/2008 | Paek | H01L 24/05 257/E23.079 |
| 7,366,364 B2 | 4/2008 | Singh | |
| 7,447,393 B2 | 11/2008 | Yan | |
| 7,460,742 B2 | 12/2008 | Joyner | |
| 7,477,384 B2 | 1/2009 | Schwabe | |
| 7,483,599 B2 | 1/2009 | Dominic et al. | |
| 7,519,246 B2 | 4/2009 | Welch et al. | |
| 7,526,007 B2 | 4/2009 | Chua et al. | |
| 7,558,301 B2 | 7/2009 | Lin et al. | |
| 7,577,327 B2 | 8/2009 | Blauvelt et al. | |
| 7,612,881 B2 | 11/2009 | Ban et al. | |
| 7,680,364 B2 | 3/2010 | Nilsson | |
| 7,720,328 B2 | 5/2010 | Yan | |
| 7,750,289 B2 * | 7/2010 | Feldman | G02B 6/4292 385/14 |
| 7,885,302 B2 | 2/2011 | Eberhard | |
| 7,885,492 B2 | 2/2011 | Welch | |
| 7,974,504 B2 | 7/2011 | Nagarajan | |
| 8,300,994 B2 | 10/2012 | Welch et al. | |
| 8,318,057 B2 * | 11/2012 | Harden | H01L 25/167 264/2.7 |
| 8,417,071 B2 | 4/2013 | Hopkins et al. | |
| 8,548,287 B2 | 10/2013 | Thacker et al. | |
| 8,559,775 B2 | 10/2013 | Babie et al. | |
| 8,564,784 B2 | 10/2013 | Wang et al. | |
| 8,659,813 B2 | 2/2014 | Davis et al. | |
| 8,724,100 B1 | 5/2014 | Asghari et al. | |
| 8,774,569 B2 | 7/2014 | Dougherty et al. | |
| 8,920,332 B2 | 12/2014 | Hong et al. | |
| 8,966,748 B2 * | 3/2015 | Leib | H01L 31/0232 29/841 |
| 8,983,250 B2 | 3/2015 | Black et al. | |
| 9,008,139 B2 * | 4/2015 | Monadgemi | H01S 5/0222 372/44.01 |
| 9,020,004 B2 | 4/2015 | Jeong | |
| 9,031,412 B2 | 5/2015 | Nagarajan | |
| 9,064,988 B2 | 6/2015 | Hsiao et al. | |
| 9,091,594 B2 | 7/2015 | Furstenberg et al. | |
| 9,110,259 B1 | 8/2015 | Black | |
| 9,135,397 B2 | 9/2015 | Denyer et al. | |
| 9,176,282 B2 | 11/2015 | Pottier | |
| 9,217,669 B2 | 12/2015 | Wu et al. | |
| 9,310,248 B2 | 4/2016 | Karlsen et al. | |
| 9,348,154 B2 | 5/2016 | Hayakawa | |
| 9,370,689 B2 | 6/2016 | Guillama et al. | |
| 9,395,494 B2 | 7/2016 | Krishnamurthi et al. | |
| 9,396,914 B2 | 7/2016 | Steiner | |
| 9,405,066 B2 | 8/2016 | Mahgerefteh | |
| 9,543,736 B1 | 1/2017 | Barwicz et al. | |
| 9,620,931 B2 | 4/2017 | Tanaka | |
| 9,702,975 B2 | 7/2017 | Brinkmeyer | |
| 9,715,064 B1 | 7/2017 | Gambino et al. | |
| 9,766,370 B2 | 9/2017 | Aloe et al. | |
| 9,804,027 B2 | 10/2017 | Fish et al. | |
| 9,829,631 B2 | 11/2017 | Lambert | |
| 9,874,701 B2 | 1/2018 | Baets et al. | |
| 9,880,352 B2 | 1/2018 | Florjanczyk | |
| 9,943,237 B2 | 4/2018 | Baker et al. | |
| 9,948,063 B2 | 4/2018 | Caneau et al. | |
| 10,009,668 B2 | 6/2018 | Liboiron-Ladouceur | |
| 10,046,229 B2 | 8/2018 | Tran et al. | |
| 10,067,426 B2 | 9/2018 | Pandey | |
| 10,132,996 B2 | 11/2018 | Lambert | |
| 10,203,762 B2 | 2/2019 | Bradski et al. | |
| 10,238,351 B2 | 3/2019 | Halperin et al. | |

(56) References Cited

U.S. PATENT DOCUMENTS

| | | | | |
|---|---|---|---|---|
| 10,268,043 | B2 | 4/2019 | Zhou et al. | |
| 10,283,939 | B2 | 5/2019 | Dawson et al. | |
| 10,285,898 | B2 | 5/2019 | Douglas et al. | |
| 10,295,740 | B2 * | 5/2019 | Bourstein | H01S 5/02326 |
| 10,310,196 | B2 | 6/2019 | Hutchison | |
| 10,374,699 | B2 | 8/2019 | Ji et al. | |
| 10,429,582 | B1 | 10/2019 | Bian et al. | |
| 10,429,597 | B2 | 10/2019 | ten Have et al. | |
| 10,436,028 | B2 | 10/2019 | Dai et al. | |
| 10,495,813 | B2 | 12/2019 | Mahgerefteh et al. | |
| 10,511,146 | B2 | 12/2019 | Lebby et al. | |
| 10,529,003 | B2 | 1/2020 | Mazed | |
| 10,634,843 | B2 | 4/2020 | Bayn et al. | |
| 10,656,429 | B2 | 5/2020 | Zhou et al. | |
| 10,687,718 | B2 | 6/2020 | Allec et al. | |
| 10,823,912 | B1 | 11/2020 | Pelc et al. | |
| 10,852,492 | B1 | 12/2020 | Vermeulen et al. | |
| 10,985,524 | B1 | 4/2021 | Bayn et al. | |
| 11,064,592 | B1 | 7/2021 | Bismuto et al. | |
| 11,086,088 | B2 | 8/2021 | Huebner et al. | |
| 11,320,718 | B1 | 5/2022 | Mahmoud et al. | |
| 11,500,139 | B2 | 11/2022 | Zhou et al. | |
| 11,525,967 | B1 | 12/2022 | Bismuto et al. | |
| 11,881,678 | B1 | 1/2024 | Bishop et al. | |
| 2002/0031711 | A1 * | 3/2002 | Steinberg | G03F 1/38 430/323 |
| 2002/0110335 | A1 * | 8/2002 | Wagner | H01S 5/4025 385/89 |
| 2002/0126940 | A1 * | 9/2002 | Kathman | G02B 6/4201 385/14 |
| 2003/0223709 | A1 * | 12/2003 | Lake | G02B 6/4248 385/94 |
| 2004/0007661 | A1 * | 1/2004 | Matsuo | H01L 31/16 250/214 LS |
| 2004/0037519 | A1 * | 2/2004 | Kilian | G02B 6/423 385/94 |
| 2004/0043533 | A1 * | 3/2004 | Chua | H01L 24/19 438/106 |
| 2004/0076382 | A1 * | 4/2004 | Saia | G02B 6/138 385/92 |
| 2004/0104460 | A1 * | 6/2004 | Stark | H01L 21/50 438/106 |
| 2004/0126117 | A1 | 7/2004 | Lo et al. | |
| 2004/0190836 | A1 * | 9/2004 | Kilian | G02B 6/4206 385/92 |
| 2004/0208428 | A1 | 10/2004 | Kikuchi et al. | |
| 2005/0053112 | A1 | 3/2005 | Shams-Zadeh-Amiri | |
| 2005/0063431 | A1 | 3/2005 | Gallup et al. | |
| 2005/0064644 | A1 * | 3/2005 | Leib | B81C 1/00301 438/202 |
| 2005/0098790 | A1 * | 5/2005 | Gallup | H01S 5/423 257/100 |
| 2005/0180698 | A1 * | 8/2005 | Hauffe | G02B 6/4286 257/E33.071 |
| 2005/0205951 | A1 * | 9/2005 | Eskridge | B81B 7/007 257/416 |
| 2006/0002443 | A1 | 1/2006 | Farber et al. | |
| 2006/0013585 | A1 | 1/2006 | Hnatiw et al. | |
| 2006/0045144 | A1 | 3/2006 | Karlsen et al. | |
| 2006/0045158 | A1 | 3/2006 | Li | |
| 2006/0182445 | A1 | 8/2006 | Lee et al. | |
| 2008/0044128 | A1 | 2/2008 | Kish et al. | |
| 2008/0310470 | A1 | 12/2008 | Ooi et al. | |
| 2009/0032690 | A1 | 2/2009 | Modavis | |
| 2009/0038843 | A1 * | 2/2009 | Yoneda | H01L 31/0203 29/841 |
| 2009/0103580 | A1 | 4/2009 | Farmer et al. | |
| 2010/0175247 | A1 * | 7/2010 | Yoneda | H01L 27/14618 29/840 |
| 2011/0069731 | A1 * | 3/2011 | Gokay | H01S 5/4018 372/50.12 |
| 2011/0163444 | A1 * | 7/2011 | Hayashi | H01L 24/10 257/738 |
| 2011/0193114 | A1 * | 8/2011 | Lerman | H01L 33/08 257/91 |
| 2012/0057816 | A1 * | 3/2012 | Krasulick | G02B 6/4245 257/E31.127 |
| 2012/0091594 | A1 * | 4/2012 | Landesberger | H01L 24/83 257/E23.068 |
| 2013/0189804 | A1 * | 7/2013 | Marchena | H01S 5/3013 438/66 |
| 2013/0210214 | A1 * | 8/2013 | Dallesasse | H01L 21/8258 438/458 |
| 2013/0229701 | A1 * | 9/2013 | Feng | G02F 1/0147 359/278 |
| 2013/0270427 | A1 * | 10/2013 | Hsiao | G02B 6/4246 250/227.28 |
| 2014/0029943 | A1 | 1/2014 | Mathai et al. | |
| 2014/0160751 | A1 * | 6/2014 | Hogan | H01S 5/02315 156/60 |
| 2014/0264844 | A1 * | 9/2014 | Ying | H01L 23/53238 257/737 |
| 2014/0269804 | A1 * | 9/2014 | Lai | G02B 6/4206 372/50.21 |
| 2015/0099318 | A1 * | 4/2015 | Krasulick | H01S 5/02325 438/27 |
| 2016/0224750 | A1 | 8/2016 | Kethman et al. | |
| 2016/0274319 | A1 * | 9/2016 | Krasulick | G02B 6/12004 |
| 2017/0005453 | A1 * | 1/2017 | Yim | H01S 5/023 |
| 2017/0164878 | A1 | 6/2017 | Connor | |
| 2017/0328772 | A1 | 11/2017 | Wijbrans et al. | |
| 2018/0011248 | A1 * | 1/2018 | Bourstein | G02B 6/122 |
| 2019/0326731 | A1 * | 10/2019 | Mathai | H01S 5/18305 |
| 2019/0339468 | A1 | 11/2019 | Evans | |
| 2019/0342009 | A1 | 11/2019 | Evans | |
| 2019/0342010 | A1 | 11/2019 | Evans et al. | |
| 2019/0377135 | A1 | 12/2019 | Mansouri et al. | |
| 2020/0073065 | A1 * | 3/2020 | Huebner | H01S 5/021 |
| 2020/0152615 | A1 | 5/2020 | Krasulick et al. | |
| 2020/0244045 | A1 | 7/2020 | Bismuto et al. | |
| 2020/0253547 | A1 | 8/2020 | Harris et al. | |
| 2020/0309593 | A1 | 10/2020 | Bismuto et al. | |
| 2020/0310112 | A1 * | 10/2020 | Hirose | H01L 31/02165 |
| 2020/0343695 | A1 * | 10/2020 | Mathai | H01S 5/02345 |
| 2020/0393615 | A1 | 12/2020 | Bayn et al. | |
| 2021/0033805 | A1 | 2/2021 | Bishop et al. | |
| 2022/0128666 | A1 | 4/2022 | Schrans et al. | |
| 2022/0221649 | A1 | 7/2022 | Sakamoto et al. | |
| 2023/0011177 | A1 | 1/2023 | Arbore | |
| 2023/0012376 | A1 | 1/2023 | Arbore et al. | |
| 2023/0085761 | A1 | 3/2023 | Witmer et al. | |
| 2023/0107907 | A1 | 4/2023 | Bismuto et al. | |
| 2023/0324286 | A1 | 10/2023 | Pelc et al. | |

FOREIGN PATENT DOCUMENTS

| | | | | |
|---|---|---|---|---|
| DE | 102004063569 A1 | * | 9/2005 | H01S 5/423 |
| DE | 60219161 T2 | * | 12/2007 | G02B 6/4204 |
| EP | 1403985 | | 3/2004 | |
| EP | 1432045 | | 6/2004 | |
| JP | H07297324 | | 11/1995 | |
| JP | 2008262118 | | 10/2008 | |
| WO | WO-0041281 A1 | * | 7/2000 | H01S 5/02253 |
| WO | WO 01/014929 | | 3/2001 | |
| WO | WO 04/031824 | | 4/2004 | |
| WO | WO 05/091036 | | 9/2005 | |
| WO | WO-2006030611 A1 | * | 3/2006 | H01L 23/3185 |
| WO | WO-2007100037 A1 | * | 9/2007 | H01L 27/14618 |
| WO | WO 11/090274 | | 7/2011 | |
| WO | WO 14/141451 | | 9/2014 | |
| WO | WO 17/040431 | | 3/2017 | |
| WO | WO 17/184420 | | 10/2017 | |
| WO | WO 17/184423 | | 10/2017 | |
| WO | WO-2017184524 A1 | * | 10/2017 | G01N 27/041 |
| WO | WO 19/152990 | | 8/2019 | |
| WO | WO 20/086744 | | 4/2020 | |
| WO | WO 20/106974 | | 5/2020 | |
| WO | WO-2020180612 A1 | * | 9/2020 | |
| WO | WO 20/240796 | | 12/2020 | |
| WO | WO 21/116766 | | 6/2021 | |
| WO | WO 22/029486 | | 2/2022 | |

(56) References Cited

FOREIGN PATENT DOCUMENTS

OTHER PUBLICATIONS

Bogaerts, et al., "Off-Chip Coupling," *Handbook of Silicon Photonics*, CRC Press, Apr. 2013, 43 pages.
Chang et al., "A Comb-Drive Actuator Driven by Capacitively-Coupled-Power," *Sensors*, 2012, pp. 10881-10889.
Dhoore et al., "Novel adiabatic tapered couplers for active III-V/SOI devices fabricated through transfer printing," Ghent University, Belgium, Optical Society of America, 2016, 16 pages.
He et al., "Integrated Polarization Compensator for WDM Waveguide Demultiplexers," *IEEE Photonics Technology Letters* vol. 11, No. 2, Feb. 1999, pp. 224-226.
Holmström et al., "MEMS Laser Scanners: a Review," *Journal of Microelectromechanical Systems*, vol. 23, No. 2, 2014, pp. 259-275.
Komljenovic et al., "Photonic Integrated Circuits Using Heterogeneous Integration on Silicon," Proceedings of the IEEE 2018, pp. 1-12.
Milanovic et al., "Compact MEMS Mirror Based Q-Switch Module for Pulse-on-demand Laser Range Finders," presented at SPIE Conference on MOEMS and Miniaturized Systems XIV, San Francisco, California, 2015, 7 pages.
Schiappelli et al., "Efficient fiber-to-waveguide coupling by a lense on the end of the optical fiber fabricated by focused ion beam milling," *Microelectronic Engineering*, 73-74, 2004, pp. 397-404.
Tsai et al., "A Laminate Cantilever Waveguide Optical Switch," 2012, downloaded Sep. 19, 2021 from IEEE Xplore, pp. 203-207.
Gonzalez-Sanchez et al., "Capacitive Sensing for Non-Invasive Breathing and Heart Monitoring in Non-Restrained, Non-Sedated Laboratory Mice," Sensors 2016, vol. 16, No. 1052, pp. 1-16.
Kybartas et al., "Capacitive Sensor for Respiratory Monitoring," Conference "Biomedical Engineering," Nov. 2015, 6 pages.
Lapedus, "Electroplating IC Packages—Tooling challenges increase as advanced packaging ramps up," *Semiconductor Engineering*, https://semiengineering.com/electroplating-ic-packages, Apr. 10, 2017, 22 pages.
Materials and Processes for Electronic Applications, Series Editor: James J. Licari, AvanTeco, Whittier, California, Elsevier Inc., 2009, 20 pages.
Worhoff et al., "Flip-chip assembly for photonic circuits," MESA+ Research Institute, University of Twente, Integrated Optical MicroSystems Group, the Netherlands, 12 pages.
U.S. Appl. No. 17/859,813, filed Jul. 7, 2022, Arbore.
U.S. Appl. No. 17/859,912, filed Jul. 7, 2022, Arbore et al.

\* cited by examiner

PHOTONIC INTEGRATED CIRCUITS WITH CONTROLLED COLLAPSE CHIP CONNECTIONS

CROSS-REFERENCE TO RELATED APPLICATION

This application is a nonprovisional of, and claims the benefit under 35 U.S.C. § 119(e) of, U.S. Provisional Patent Application No. 63/053,841, filed Jul. 20, 2020, the contents of which are incorporated herein by reference as if fully disclosed herein.

FIELD

The described embodiments relate generally to photonic integrated circuits. More particularly, the present embodiments relate to systems and methods for producing photonic integrated circuits that can be assembled using controlled collapse chip connections.

BACKGROUND

Photonic integrated circuits include integrated optical circuits that employ photonic components that emit and/or absorb optical signals such as visible or infrared light. Photonic integrated circuits can include optical emitters such as laser emitters and can be manufactured using microfabrication techniques such as micromachining and lithography to create features of the photonic circuit on a substrate. Photonic components such as lasers may be coupled with the circuit at various stages in the manufacturing process and one or more steps may be performed after the addition of the photonic components such as coating to help protect these components from contamination or damage. Once assembled the photonic integrated circuit may be interconnected to other semi-conductor devices.

SUMMARY

Embodiments are directed to an optical device including a first substrate defining a surface and a trench forming a depression along a portion of the surface, and a second substrate coupled with the surface and extending from the surface to form a raised portion around the trench. The optical device may also include a laser die positioned within the trench, such that the laser die is surrounded by the second substrate, and an optical material positioned within a region between the laser die and the second substrate. The optical device may further include a third substrate coupled with the second substrate such that the second substrate is positioned between the first substrate and the third substrate. The second substrate may be configured to at least partially isolate the laser die from mechanical stress exerted on the optical device.

In some embodiments the optical device further includes an optical output, a fill material positioned between the first substrate and the second substrate, and a fill dam configured to retain the fill material such that it does not cover the optical output. In some cases, the optical device includes a fill dam coupled with the third substrate and extending toward the first substrate. In some cases, a bottom edge of the fill dam is offset from the first substrate. The fill dam may be configured to retain a fill material within a space between the first substrate and the third substrate. In some embodiments, the optical device includes an interconnect formed from an electrically conductive material that is positioned on the third substrate. In some cases, the third substrate comprises a first surface that faces toward the first substrate and a second surface opposite the first surface, and the interconnect is positioned on the second surface. In further examples, the interconnect is electrically coupled to the laser die.

Embodiments described herein are also directed to a method of manufacturing an optical device, where the method includes forming a trench in a first substrate that defines a depression along a surface of the first substrate and forming a raised feature comprising a second substrate around the trench. The raised feature may extend from the surface. The method may also include coupling a laser die to the first substrate such that the laser die is positioned within the trench and surrounded by the raised feature, and introducing a first optical material to a first region between the raised feature and the laser die. The method may also include coupling a third substrate to the raised feature such that the raised feature is positioned between the first substrate and the third substrate, and introducing a second material into a second region at least partially defined by the first substrate, the raised feature, and the third substrate.

In some embodiments, the method may further include forming a fill dam on the third substrate that extends toward the first substrate and is offset from the first substrate when the second substrate is coupled to the raised feature. In some cases, the method can include forming an interconnect on the second substrate, where the interconnect is positioned on an external surface of the third substrate and is coupled to the raised feature.

Embodiments described herein are also directed to an optical device, including a first substrate that defines a surface including a first electrical contact, and a trench forming a depression along a portion of the surface. The optical device can also include a laser die positioned within the trench and coupled with the first electrical contact, and a first material coupled with the laser die and at least a portion of the first substrate. A second substrate may be coupled to the first substrate and form a cavity around the laser die, and the second substrate can include a second electrical contact that is electrically coupled to the first electrical contact. An electrical interconnect can be coupled to an outer surface of the second substrate and electrically coupled with the second electrical contact.

In some embodiments, the first material forms a layer covering the laser die and at least a portion of the first substrate, the second substrate may be a silicon wafer, and the cavity can be etched from the silicon wafer. The electrical interconnect may include a solder based material that is configured to electrically couple the laser die with an electrical circuit. In some cases, the first material includes a conformal coating that covers the laser die and at least a portion of the first substrate. In some examples, the second substrate is formed from a silicon material, and the second substrate includes a via extending through the silicon material. The via may contain an electrically conductive material comprising the second electrical contact. In some cases, the electrical interconnect is at least partially positioned on an external surface of the second substrate.

Embodiments described herein include a method of forming an optical device, where the method includes forming a trench in a first substrate that defines a depression along a surface of the first substrate. The method may include depositing a first electrical contact onto the first substrate such that a first portion of the first electrical contact is located in the trench, and coupling a laser die to the first substrate such that the laser die is positioned within the trench. A first material may be applied over the laser die and at least a portion of the first substrate. In some cases, the method further includes coupling a second substrate to the first substrate such that a second electrical contact of the second substrate is electrically coupled with the first electrical contact. The second substrate may form a cavity around the laser die. The method may also include forming an electrical interconnect on an outer surface of the second substrate such that the electrical interconnect is electrically coupled to the second electrical contact.

In some embodiments, the second substrate is a silicon material, and the method may further include etching the second substrate to form at least a portion of the cavity in the silicon material. In some cases, the electrical interconnect is formed using a ball drop process to deposit a solder based material on the second substrate.

BRIEF DESCRIPTION OF THE DRAWINGS

The disclosure will be readily understood by the following detailed description in conjunction with the accompanying drawings, wherein like reference numerals designate like structural elements, and in which.

Figure 1A:
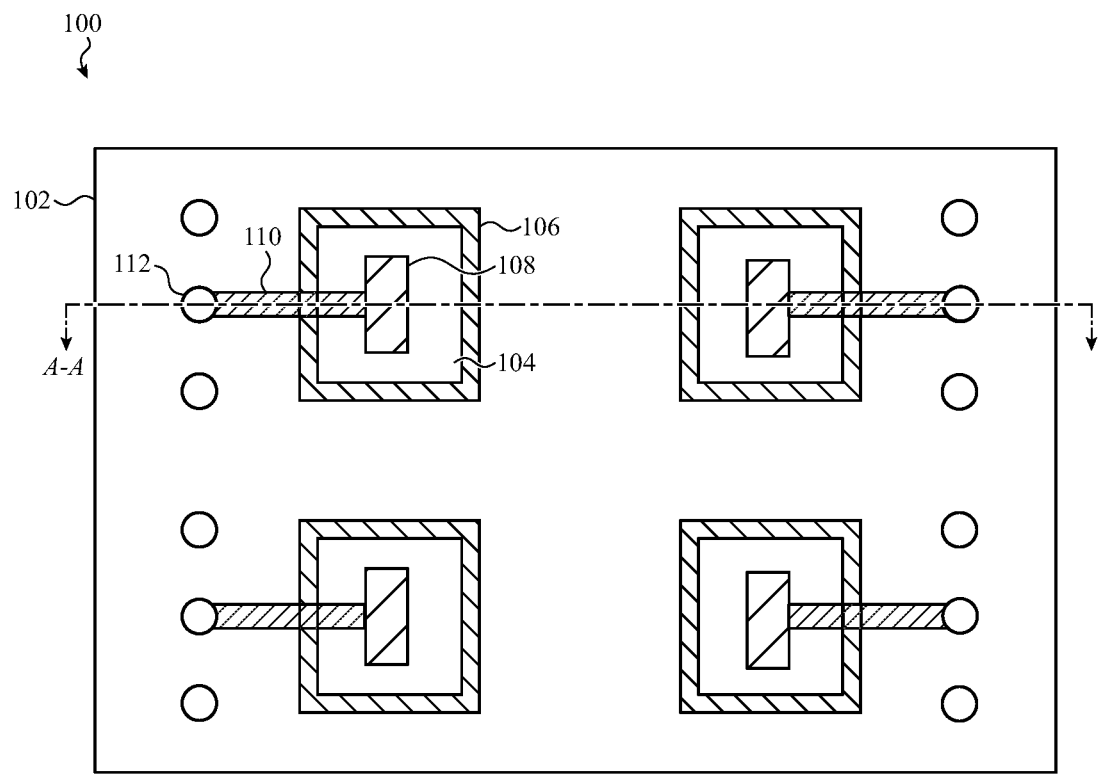
FIGS. 1A and 1B illustrate top and cross-sectional views, respectively, of a first example optical device.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any characteristics attribute, or property for any element illustrated in the accompanying figures.

Additionally, it should be understood that the proportions and dimensions (either relative or absolute) of the various features and elements (and collections and groupings thereof) and the boundaries, separations, and positional relationships presented there between, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

Embodiments described herein include an optical device such as a photonic integrated circuit (PIC) that includes optical components such as laser dice and structures for protecting the optical components. In a first set of embodiments, an optical device can include a first substrate material that has a depression defining a trench and a second substrate that forms a wall around the trench. An optical output such as a laser die may be positioned within the trench and a third substrate may be positioned on the wall formed by the second substrate. The trench, the wall, and the third substrate may form a cavity around the laser die. In some cases, the cavity may contain an optical fill material in the space defined by the trench, the wall, and the third substrate. Accordingly, the laser die may be isolated from contamination and protected from mechanical stress experienced by the optical device. In some embodiments, interconnects such as controlled collapse chip connections (also referred to as C4 or flip chip connections), copper pillar connections, gold stud bumps, or a combination thereof can be positioned on an outer surface of the third substrate. Thus, the optical device can be interconnected to other integrated circuits using C4 (flip chip), copper pillar, gold stud bump, or other suitable connection methods.

In some embodiments, a fill material may be introduced to a space between the first substrate and the third substrate. For example, the wall formed from the second substrate may offset the first substrate from the third substrate thereby creating a gap between these components. A fill material may be injected into this gap to fill the space between the first and the third substrates. In some cases, the optical device may include a fill dam to help control the location of the fill material within the gap. For example, the fill dam may be formed on the first substrate and extend toward the first substrate. The fill dam may define a structure that blocks the movement of the fill material. In some cases, the fill dam may be located near a facet or optical output of the optical device. Thus, the fill dam may prevent the fill material from covering or otherwise interfering with an optical output of the optical device.

In another set of embodiments, an optical device can include a first substrate material that has a depression defining a trench and a second substrate material that has a recessed feature. A laser die may be positioned within the trench and the first and second substrates can be joined to form a cavity around the laser die. The cavity can be defined by the trench in the first substrate and the recessed feature in the second substrate. The cavity may isolate the laser die from contamination and/or protect the laser die from mechanical stress experienced by the optical device. In some embodiments, interconnects (C4/flip chip) can be positioned on an outer surface of the second substrate. Thus, the optical device can be interconnected to other integrated circuits using C4 or flip chip connection methods.

These and other embodiments are discussed below with reference to FIGS. 1-8. However, those skilled in the art will readily appreciate that the detailed description given herein with respect to these Figures is for explanatory purposes only and should not be construed as limiting.

Figure 1B:
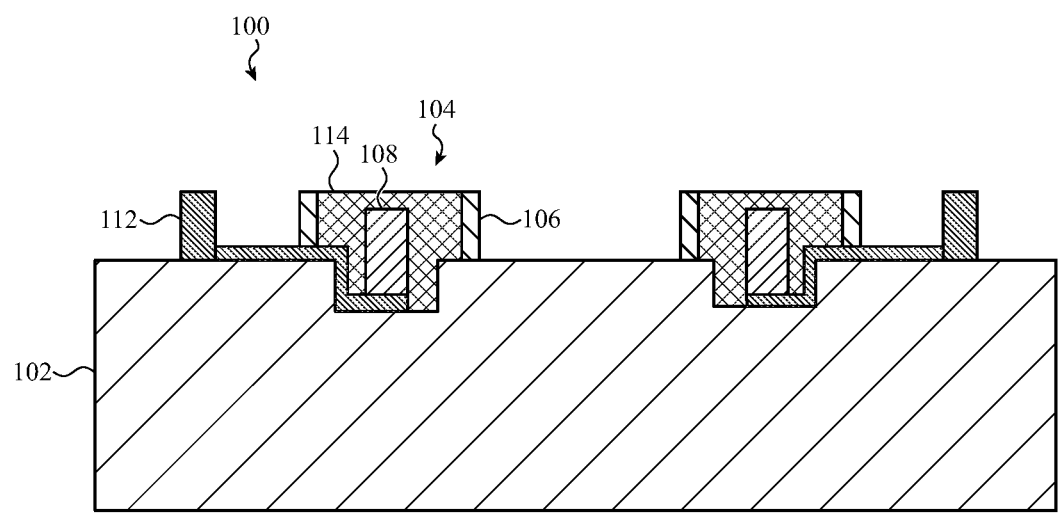

FIG. 1A illustrates a top view of an optical device 100, and FIG. 1B illustrates a cross-sectional view of the optical device taken along line A-A. As illustrated, multiple optical devices may be formed on a first substrate 102, one of which is labeled for clarity. The optical device 100 can include a trench 104 that is defined by a depressed region in an upper surface of the first substrate 102. A second substrate can define a wall 106 that is formed around the trench 104 and extends from the upper surface of the first substrate 102. In some embodiments, the wall 106 can form a closed perimeter around the trench 104. A photonic device such as a laser die 108 can be positioned within the trench 104 and surrounded by the wall 106. The laser die 108 can be coupled to an electrical contact 110, which can be coupled to a post 112 or interconnection bump; the term "post," as used herein, encompasses bumps as well. The post 112 can be formed from C4 interconnections, copper post connections, gold stud bump connections, or other suitable connections, and multiple posts 112 can be distributed along a surface of the first substrate 102, for example, to form an array of posts 112.

In some embodiments, the optical device 100 can include an optical fill material 114 in a region between the wall 106 and the laser die 108. The optical fill material 114 can be introduced into the region between the wall 106 and the laser die 108 as a liquid/viscous material such that it conforms or at least partially conforms to the surfaces in this region formed by the wall 106 and the laser die 108. The optical fill material 114 can be cured to form a solid or semi-solid structure around the laser die 108. In some examples, the optical fill material 114 may not be cured until one or more additional processing steps have occurred such as adding additional structures/elements to the optical device 100 as described herein. The optical fill material 114 can include an optical underfill material, adhesive, or the like.

In some embodiments, the first substrate 102 can be formed from a silicon, ceramic, plastic, or other suitable material and the trench 104 can be machined, etched, or formed in the material using processes such as patterned lithography techniques. The second substrate, defining the wall 106, can be formed from a variety of materials. For example, the wall 106 may be formed from an organic or ceramic substrate and be plated using copper and/or solder to create a structure that extends or is raised from the surface of the first substrate 102. In cases where the wall 106 forms a closed perimeter around the trench 104, the wall 106 and the trench 104 may form a first portion of a closed cavity around the laser die 108 that isolates the laser die 108. The wall 106 can be configured to be more rigid than the laser die 108, such that the wall 106 can isolate/protect the laser die 108 from mechanical stress or other physical disturbances. In some examples, a top of the wall 106 may extend to a height of the top of the laser die 108 when the laser die is positioned with in the trench 104 and is coupled with the first substrate 102. In some cases, the wall 106 can extend above the laser die 108 such that a top of the wall 106 is above a top of the laser die 108.

In some embodiments, the wall 106 is formed using repassivation techniques with materials that can include polyimide, polybenzocyclobutene, or benzocyclobutene, and a redistribution layer that can be formed by metal pattern plating processes that includes forming C4 solder bumps, metal studs, or metal pillars (collectively, "posts"). In some cases, forming the wall can include forming passivation layers on one or more of these components. In some examples, the bump, stud, and/or pillar heights can be between about 10 and about 150 micrometers, the redistribution layer thickness can be between about 1 micrometer and about 5 micrometers, and the passivation thickness can be between about 1 micrometer and about 20 micrometers.

Figure 2:
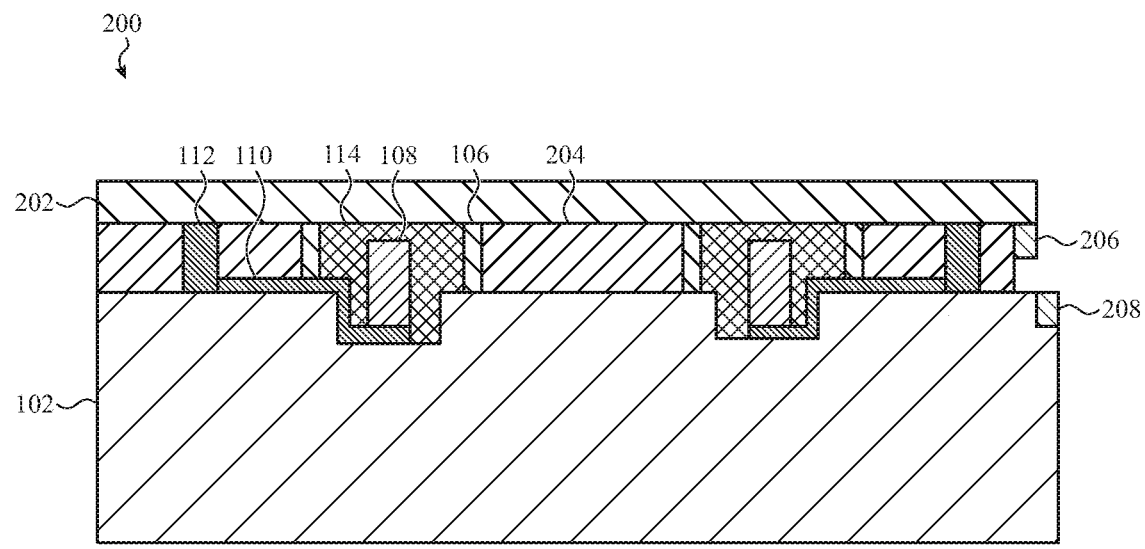
FIG. 2 illustrates a cross-sectional view of a first example of an optical device.

FIG. 2 illustrates a cross-sectional view of an optical device 200 taken along line A-A and further including a third substrate 202, a fill material 204, a fill dam 206 and an optical output 208. The optical device 200 may be an example of the optical device 100 and can include a first substrate 102 having a trench 104, a wall 106 positioned around the trench 104, a laser die 108 positioned within the trench 104, and an optical fill material 114 as described with reference to FIG. 1. The third substrate 202 may be positioned on top of the wall 106 such that it is offset from the first substrate 102. The fill material 204 may be located between the first substrate 102 and the third substrate 202. The fill dam 206 may extend from the third substrate 202 and towards the first substrate 102, and the optical output 208 may be located on the first substrate 102.

In some embodiments, the third substrate 202 may form a layer of material that is coupled with the second substrate forming the wall 106. The third substrate 202 may be formed from a silicon, ceramic, organic, or other suitable material and may partially define a space that is defined by an upper surface of the first substrate 102, an outer surface of the wall 106, and a lower surface of the third substrate 202. The third substrate 202 may be at least partially supported by the wall 106. The third substrate 202 may also be coupled with the post 112 (which may be an interconnection bump) using C4, copper pillar, or gold stud bump connection techniques. In some embodiments, a fill material 204 can be introduced into the space between the first substrate 102, the wall 106, and the third substrate 202. The fill material 204 can be introduced as a liquid or viscous material and be injected or flow into the space defined by the first substrate 102, the wall 106, and the third substrate 202. The fill material 204 can be cured such that it hardens to form a more structurally rigid material. In some cases, the optical fill material 114 and the fill material 204 can be cured at the same or similar times to couple the third substrate 202 to the wall 106 and the first substrate 102. The fill material 204 can include an optical underfill material, adhesive, or the like.

The combination of the wall 106 and the fill material 204 can create a structural support between the first substrate 102 and the third substrate 202 such that the laser die 108 is isolated and/or protected from mechanical stress. In some cases, the optical fill material 114, the first substrate 102, the wall 106, and the third substrate 202 can also protect the laser die 108 from contaminants such as dust, debris, moisture, and the like.

In some embodiments, the fill dam 206 can be positioned along the third substrate 202 and extend towards the first substrate 102. The fill dam 206 can help retain the fill material 204 within the space between the first substrate 102 and the third substrate 202 such that the fill material does not cover the optical output 208. For example, the fill dam 206 may extend towards an upper surface of the first substrate 102 such that there is a smaller gap between the first substrate 102 and the fill dam 206 than there is between the first substrate 102 and the third substrate 202. In some examples, the fill dam 206 can form a gap with the first substrate 102 that is between 10 micrometers and 80 micrometers. Accordingly, as fill material 204 is introduced into the optical device 200 (through injection, surface tension, or other technique), the fill dam 206 may prevent the fill material 204 from spreading over the optical output 208. In some cases, the size and positioning of the fill dam 206 may be based on one or more properties of the fill material 204 such as a viscosity, surface tension, and so on. In some cases, the optical output 208 may include a facet.

Figure 3:
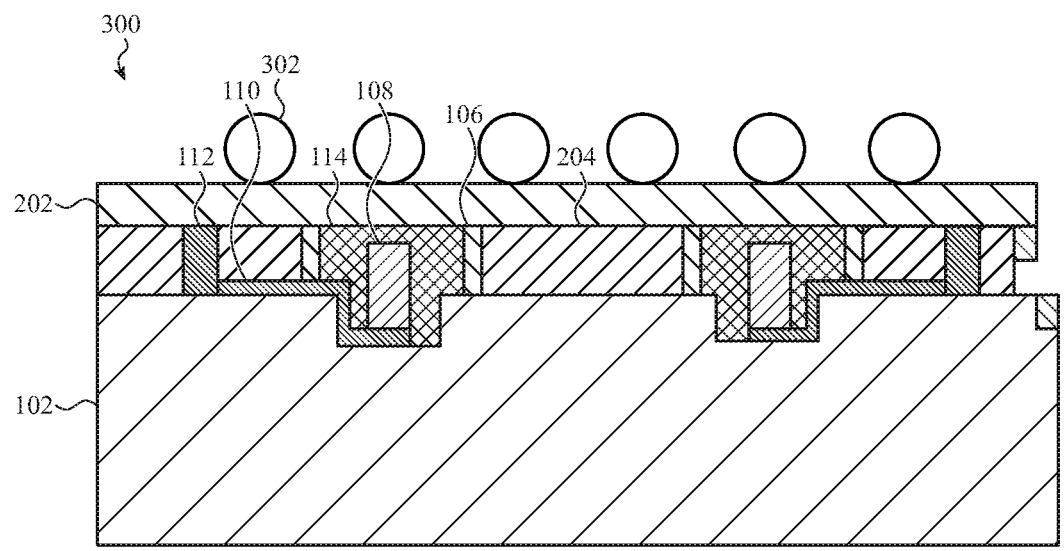
FIG. 3 illustrates a cross-sectional view of a first example of an optical device.

FIG. 3 illustrates a cross-sectional view of an optical device 300 taken along line A-A and also including one or more interconnects 302 positioned along an upper surface of the third substrate 202. The optical device 300 may be an example of the optical devices 100 and 200 and can include a first substrate 102 having a trench 104, a wall 106 positioned around the trench 104, a laser die 108 positioned within the trench 104, an optical fill material 114, a third substrate 202, a fill material 204, a fill dam 206 and an optical output 208 as described with reference to FIGS. 1 and 2.

In some embodiments, the interconnects 302 can be deposited on an upper surface of the third substrate 202. The interconnects 302 can be formed from solder, copper, gold, or other suitable materials, or a combination thereof, and used for bonding the optical device to another device such as another integrated circuit that may be used to drive the laser die 108. In some embodiments, the interconnects 302 can be configured to allow for flip chip (C4) bonding of the optical device to other wafer devices. In some embodiments, one or more interconnects 302 may be electrically coupled with the post 112 (and electrical contact 110) such that the interconnect 302 is electrically coupled to the laser die 108.

In some embodiments, one or more portions of a chip may be divided such that different optical devices 300 that were formed on a single chip can be separated in multiple discrete optical devices 300. After the separation, the optical devices may undergo inspections such as a visual inspection to confirm that they are ready to be bonded to other devices such as other integrated circuits using flip chip (C4) bonding techniques.

Figure 4:
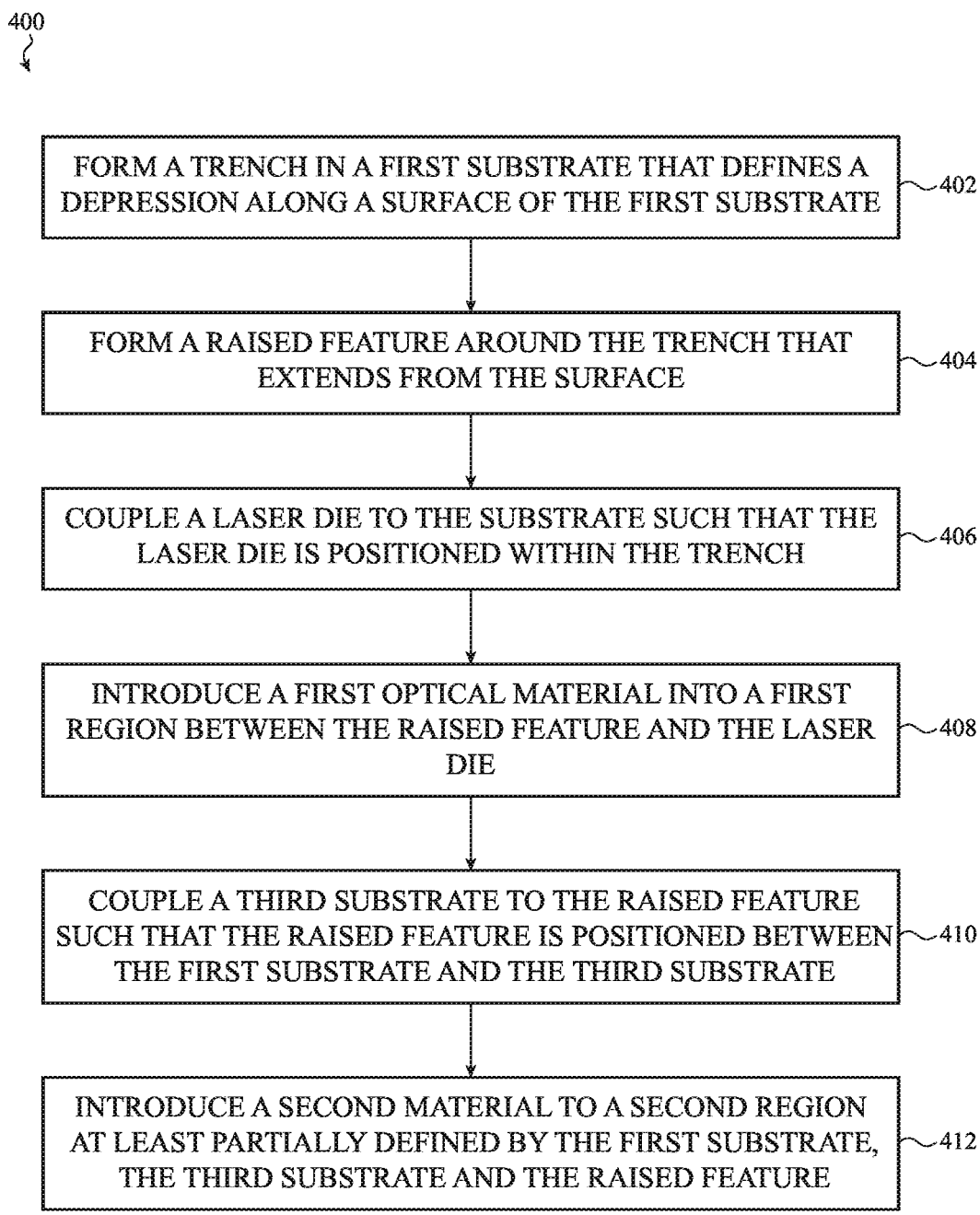
FIG. 4 illustrates an example method for manufacturing a first example of an optical device.

FIG. 4 illustrates an example method 400 for manufacturing an optical device such as the optical devices 100, 200, and 300 described with reference to FIGS. 1-3. At 402, the method 400 may include forming a trench in a first substrate that defines depression along a surface of the first substrate. For example, the first substrate may include a silicon material and the trench may be etched, machined, or formed using other suitable processes such as lithographic patterning processes. In some cases, the depth of the trench may be defined based on a size of a photonic device such as a laser die that is to be at least partially located within the trench. The trench may form a first portion of a cavity that surrounds the laser die. In some cases, conductive traces may be created in the trench that are used to couple the laser die to one or more driver circuits.

At 404, the method 400 may include forming a raised feature using a second substrate, which may be the same or different material as the first substrate. The second substrate can form a wall around the trench that extends from the surface of the first substrate. The raised feature may be formed from an organic or ceramic material or other suitable materials. In some cases, the raised feature may be coated with copper, solder, gold, or a combination thereof, which may be used to couple the raised feature to one or more other components of the optical device. The raised feature may at least partially isolate a photonic component such as a laser die from the surrounding environment, and/or provide protection from mechanical stress applied to the optical device.

At 406, the method 400 can include coupling a laser die to the first substrate such that the laser die is positioned within the trench defined by the first substrate. In some cases, the laser die may be coupled with electrical traces/contacts that are located within the trench. The laser die may be partially surrounded by the trench. In some cases, the laser die may also be partially surrounded by the raised feature that surrounds the trench.

At 408, the method 400 may include introducing a first optical material into a first region between the raised feature and the laser die. The optical fill material may include a liquid/viscous material that can flow around the laser die and trench to conform to features of the laser die and the trench. In some cases, the optical fill material may be cured after settling into the region between the laser die and the trench. In some examples, the optical fill material may be transparent when cured such that light emitted from the laser die can pass through the cured optical fill material. The optical fill material may stabilize the laser die in place, protect it from contamination (dust, debris, moisture and the like), and help isolate the laser die from mechanical stress or other physical disruptions.

At 410, the method 400 may include coupling a third substrate to the raised feature such that the raised feature is positioned between the first substrate and the third substrate. In some cases, coupling the third substrate to the raised feature may be accomplished using physical connections such as a solder, gold, or copper materials, the optical fill material, or other fill materials as described herein. The third substrate may be offset from the first substrate by the raised feature to form a space or region between the first and second substrates.

At 412, the method 400 can include introducing a second fill to a second region at least partially defined by the first substrate, the second substrate, and the raised feature. The second material may be introduced to the second region as a liquid and be injected or flow into the second region via surface tension forces, or other suitable processes. Once in place, the fill material can be cured to transform it to a solid material, which can include heat curing, light curing, or other suitable methods.

In some embodiments, the method 400 may include forming a fill dam on the third substrate such that the fill dam extends toward the first substrate and is offset from the first substrate. A lower edge of the fill dam may form a smaller gap with the first substrate that prevents or resists the fill material from moving past the fill dam. The fill damn may be used to control where fill material can move to within the second region and prevent the fill material from covering an optical output of the optical device such as a facet. In some cases, the method 400 can include forming one or more interconnects on an outer surface of the second substrate. The interconnects may be used to couple the optical device to other devices using flip chip (C4) bonding techniques.

Figure 5A:
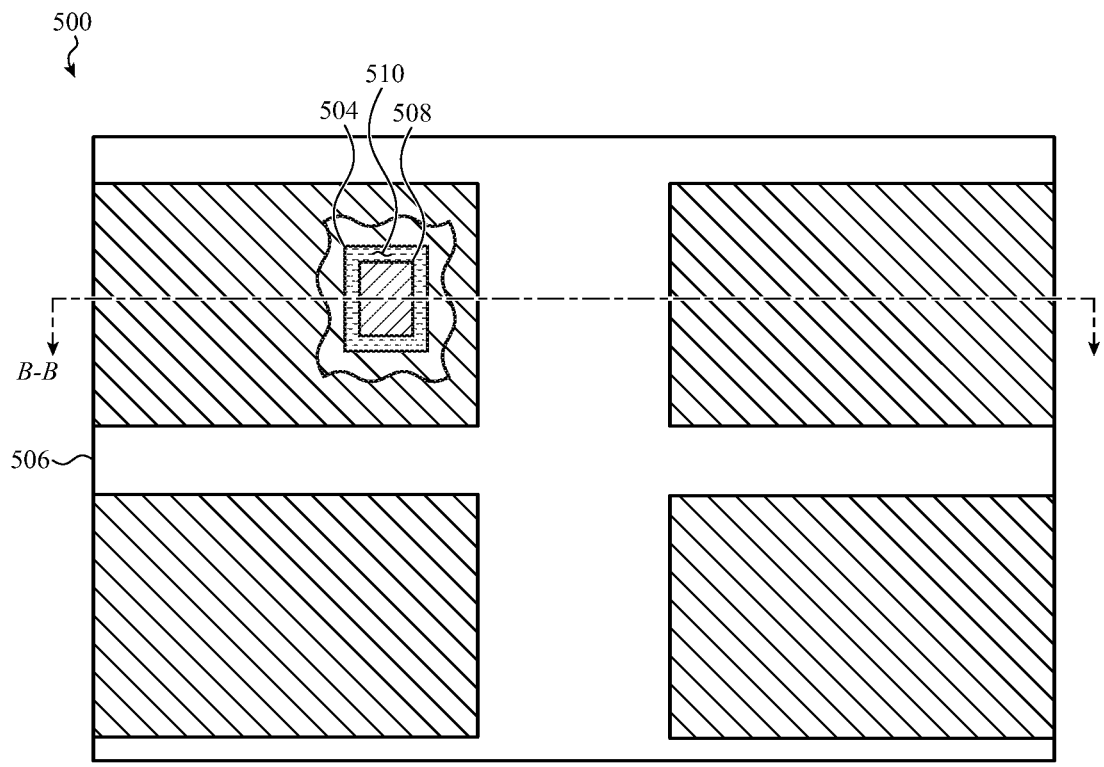
FIGS. 5A and 5B illustrate top and cross-sectional views, respectively, of a second example of an optical device.
Figure 5B:
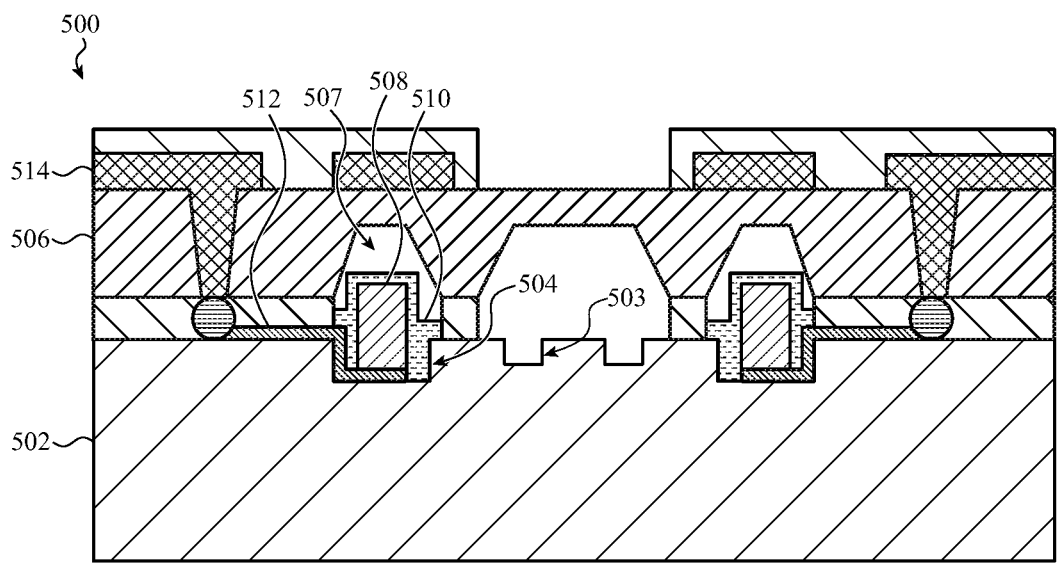

FIG. 5A illustrates a top view of an optical device 500 and FIG. 5B illustrates a cross-sectional view of the optical device 500 taken along line B-B. The optical device 500 can be an example of a photonic integrated circuit having an optical output, such as a laser die 508, protected by a capping substrate such as a silicon capping wafer (which may be referred to as a second substrate 506). As illustrated, multiple optical devices may be formed on a first substrate 502, one of which is labeled for clarity. In some cases, the first substrate is a silicon photonics substrate. The optical device 500 can include an optical facet 503 and a trench 504 that is defined by depressed regions in an upper surface of the first substrate 502. The optical facet 503 and/or the trench 504 can be formed in the first substrate 502 using etching techniques or other suitable processes, such as those described herein with respect to the trench 504, or any other suitable process. A second substrate 506, which may be an example of a silicon capping substrate or wafer, can be coupled with the first substrate to form one or more cavities in the optical device 500. The second substrate 506 can be a silicon capping wafer and a facet can be located within a first cavity of the wafer. Similarly, the laser die 508 can be located within a second cavity formed by coupling the first substrate 502 (e.g., the silicon photonics substrate) and the second substrate 506. The cavity can isolate photonic components, such as the facet 503 and the laser die 508 from the surrounding environment, which can protect these components from mechanical stress applied to the optical device, protect them from other physical damage, and isolate them from contamination, debris, and so on.

In some embodiments, a first material, which can include an optical underfill, can couple the laser die 508 to the first substrate 502 and/or the second substrate 506. The first material can encapsulate the laser die 508 to protect the laser die such as by reducing stress between the laser die 508 and the first substrate 502. The laser die 508 can also be coupled with a first electrical contact 512, which can be partially located in the trench 504. In some embodiments, the second substrate 506 can include a second electrical contact 514, which can be coupled to the first electrical contact 512.

In some embodiments, the first substrate 502 can be formed from a silicon material (or any other suitable material, which may include a ceramic or plastic) and the trench 504 can be machined, etched, or formed in the silicon material using any suitable processes such as patterned lithography techniques. The second substrate 506 can be formed from a silicon material and the second substrate 506 can be etched, machined, or manufactured using other suitable techniques to create a recess 507 in the second substrate 506 that forms an upper portion of the cavity. Etching of the first substrate 502 and/or the second substrate 506 can be performed along crystalline planes in the silicon material. In some embodiments, the trench 504 can be created in the first substrate, and independently, the recess 507 can be created in the second substrate 506. The first substrate 502 and the second substrate 506 can be joined to form the cavity. The first substrate 502 and the second substrate 506 can be bonded together using solder based connections, or other suitable methods such as adhesive bonding. In some embodiments, the second substrate (e.g., the capping wafer) may be formed from a material other than silicon.

In some embodiments, the laser die 508 can be positioned within the trench 504 and coupled to the first substrate 502 prior to bonding the first substrate 502 with the second substrate 506. In some embodiments, the facet 503 is also formed in the first substrate 502 and also contained within the recess 507 that is formed after joining the first substrate 502 and the second substrate 506. In other cases, the optical facet 503 can be located in a different cavity from the laser die. The first electrical contact 512 can be deposited onto the first substrate 502 and the laser die 508 can be bonded to the first electrical contact 512. The first electrical contact 512 can include electrically conductive traces that are partially located within the trench 504. In some cases, the first electrical contact 512 can also be positioned along a portion of the first substrate 502 that is adjacent the trench 504. In some embodiments, a first material 510, such as an optical underfill, can be deposited around the laser die 508 and a portion of the first substrate 502 to form a layer/coating that covers the laser die 508, which may help protect the laser die 508 from contaminants such as dust, debris, moisture, or the like.

When the first substrate 502 is coupled with the second substrate 506, the cavity/cavities around the facet 503 and/or laser die 508 may protect the facet 503 and laser die 508 from contaminants (dust, debris, moisture, etc.), mechanical stress, or other physical disruptions. For example, the first substrate 502 and the second substrate 506 may form a protective barrier around the facet 503 and/or the laser die 508.

In some embodiments, the second substrate 506 can include a via that comprises at least a portion of the second electrical contact 514. The second electrical contact 514 may couple to the first electrical contact 512 and also include a portion of electrically conductive material that is located on an external surface of the second substrate 506. Thus, the second electrical contact 514 may be used to electrically couple the laser die 508 (or other photonic component) to an external device such as an integrated circuit that is used to drive the laser die 508.

Figure 6:
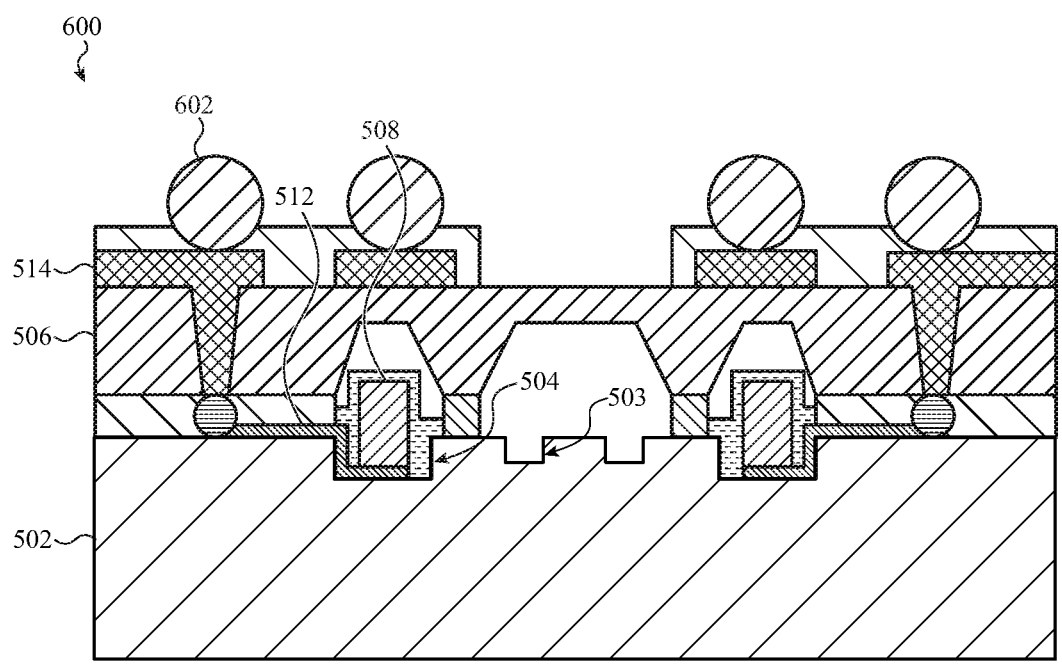
FIG. 6 illustrates a cross-sectional view of a second example of an optical device.

FIG. 6 illustrates a cross-sectional view of an optical device 600 taken along line B-B and further comprising one or more electrical interconnects 602. The optical device 600 can be an example of the optical device 500 and include the first substrate 502, the second substrate 506, the facet 503, the laser die 508, the first electrical contact 512, and the second electrical contact 514 described with reference to FIG. 5.

In some embodiments, the interconnects 602 can be deposited on an upper surface of the second substrate 506. The interconnects 602 can be formed from a solder based material and used for bonding the optical device to another device such as another integrated circuit that may be used to drive the laser die 508. In some embodiments, the interconnects 602 can be configured to allow flip chip (C4) bonding, copper pillar bonding, or gold stud bump bonding of the optical device to other wafer devices. In some embodiments, one or more interconnects 602 may be electrically coupled with the second electrical contact 514 (and the first electrical contact 512) such that the interconnect 602 is electrically coupled to the laser die 508. Thus, the interconnects 602 may be used to connect the laser die 508 to other devices (other integrated circuits) that are used to drive the laser die 508.

Figure 7:
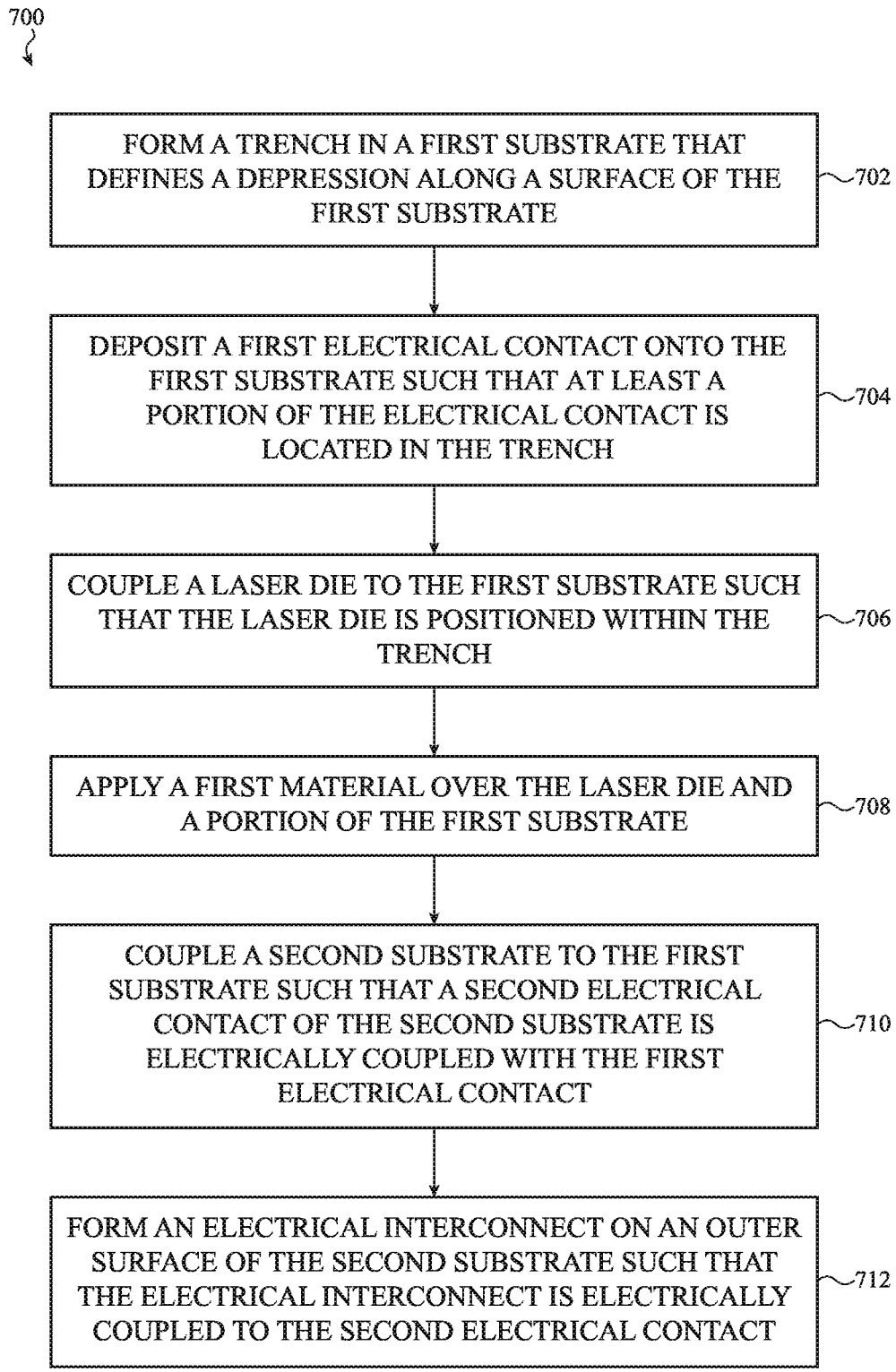
FIG. 7 illustrates an example method for manufacturing a second example of an optical device.

FIG. 7 illustrates an example method 700 for manufacturing an optical device such as the optical devices 500 and 600 described with reference to FIGS. 5 and 6. At 702, the method 700 may include forming a trench in a first substrate that defines a depression along a surface of the first substrate. For example, the first substrate may include a silicon material and the trench may be etched, machined, or formed using other suitable processes such as lithographic patterning processes. In some cases, the depth of the trench may be defined based on a size of a photonic device such as a laser die that is to be at least partially located within the trench. The trench may form a first portion of a cavity that surrounds the laser die. In some cases, an optical facet can be formed in the first substrate using etching, machining, or other suitable techniques.

At 704, the method 700 may include depositing a first electrical contact onto the first substrate such that at least a portion of the electrical contact is located in the trench. In some cases, the first electrical contact may include one or more conductive traces positioned in the trench that are used to couple the laser die to one or more driver circuits. The first electrical contact may extend from the trench and along a portion of the first substrate, for example, to a location where a via from another layer will interface with the first substrate.

At 706, the method 700 can include coupling a laser die to the first substrate such that the laser die is positioned within the trench defined by the first substrate. In some cases, the laser die may be coupled with first electrical contact/traces that are located within the trench. The laser die may be partially surrounded by the trench.

At 708, the method 700 may include applying a first material over the laser die and at least a portion of the first substrate. In some cases, the first material may include a conformal coating that covers the laser die. The first material may be selected to protect the laser die from contamination such as dust, debris, or moisture.

At 710, the method 700 may include coupling a second substrate to the first substrate such that a second electrical contact of the second substrate is electrically coupled with the first electrical contact. In some cases, the second substrate may have a via that includes the second electrical contact and the via may align with the first electrical contact to provide an electrical path from the laser die to an external surface of the second substrate.

At 712, the method 700 may include forming an electrical interconnect on an outer surface of the second substrate such that the electrical interconnect is electrically coupled to the second electrical contact. The interconnects may include a solder based material or other suitable electrically conductive material that can be used to couple the optical device to other devices using flip chip (C4), copper pillar, gold stud bump, or other bonding techniques.

Figure 8:
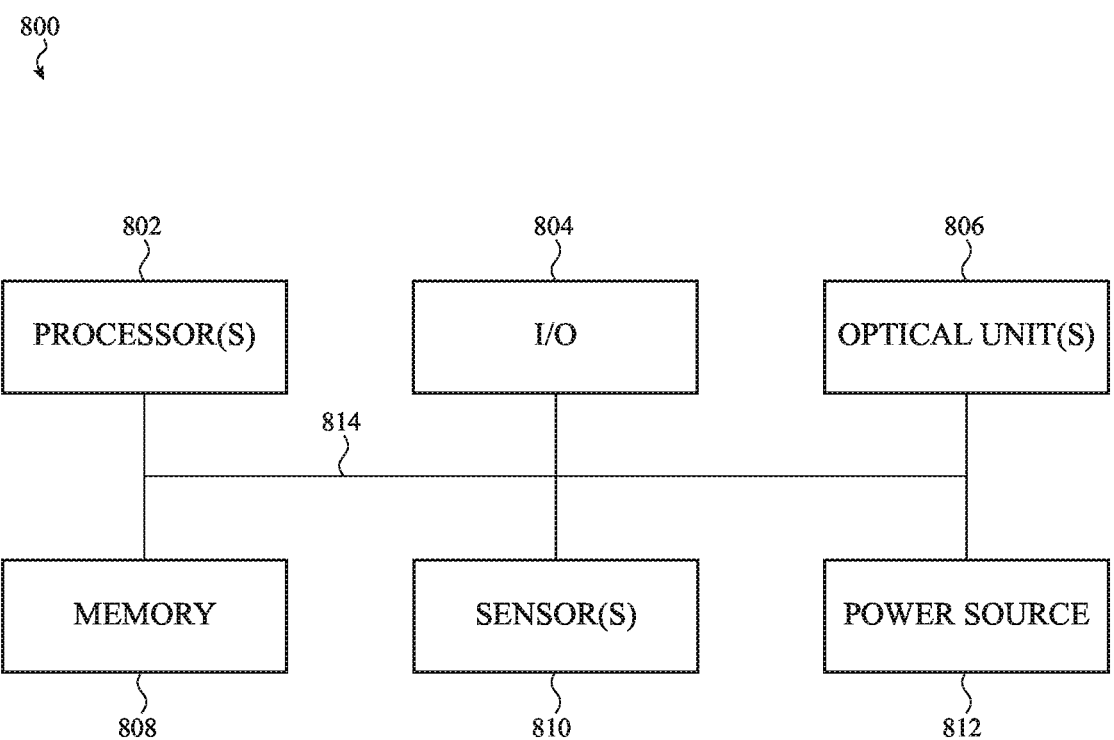
FIG. 8 illustrates an example block diagram from an optical device.

FIG. 8 illustrates an example block diagram of an optical device 800, which may in some cases take the form of any of the optical devices as described with reference to FIGS. 1-7. The optical device can include a processor 802, an input/output (I/O) mechanism 804 (e.g., an input/output device, such as a touch screen, crown or button, input/output port, or haptic interface), one or more optical units 806 (e.g., a photonic device such as a laser die), memory 808, sensors 810 (e.g., an optical sensing system), and a power source 812 (e.g., a rechargeable battery). The processor 802 can control some or all of the operations of the optical device 800. The processor 802 can communicate, either directly or indirectly, with some or all of the components of the optical device 800. For example, a system bus or other communication mechanism 814 can provide communication between the processor 802, the I/O mechanism 804, the optical unit 806, the memory 808, the sensors 810, and the power source 812.

The processor 802 can be implemented as any electronic device capable of processing, receiving, or transmitting data or instructions. For example, the processor 802 can be a microprocessor, a central processing unit (CPU), an application-specific integrated circuit (ASIC), a digital signal processor (DSP), or combinations of such devices. As described herein, the term "processor" is meant to encompass a single processor or processing unit, multiple processors, multiple processing units, or other suitable computing element or elements.

It should be noted that the components of the optical device 800 can be controlled by multiple processors. For example, select components of the optical device 800 (e.g., a sensor 810) may be controlled by a first processor and other components of the optical device 800 (e.g., the optics unit 806) may be controlled by a second processor, where the first and second processors may or may not be in communication with each other.

The I/O mechanism 804 can transmit and/or receive data from a user or another electronic device. An I/O device can include a display, a touch sensing input surface, one or more buttons (e.g., a graphical user interface "home" button), one or more cameras, one or more microphones or speakers, one or more ports, such as a microphone port, and/or a keyboard. Additionally or alternatively, an I/O device or port can transmit electronic signals via a communications network, such as a wireless and/or wired network connection. Examples of wireless and wired network connections include, but are not limited to, cellular, Wi-Fi, Bluetooth, IR, and Ethernet connections.

The memory 808 can store electronic data that can be used by the optical device 800. For example, the memory 808 can store electrical data or content such as, for example, audio and video files, documents and applications, device settings and user preferences, timing signals, control signals, and data structures or databases. The memory 808 can be configured as any type of memory. By way of example only, the memory 808 can be implemented as random access memory, read-only memory, Flash memory, removable memory, other types of storage elements, or combinations of such devices.

The optical device 800 may also include one or more sensors 810 positioned almost anywhere on the optical device 800. The sensor(s) 810 can be configured to sense one or more type of parameters, such as but not limited to, pressure, light, touch, heat, movement, relative motion, biometric data (e.g., biological parameters), and so on. For example, the sensor(s) 810 may include a heat sensor, a position sensor, a light or optical sensor, an accelerometer, a pressure transducer, a gyroscope, a magnetometer, a health monitoring sensor, and so on. Additionally, the one or more sensors 810 can utilize any suitable sensing technology, including, but not limited to, capacitive, ultrasonic, resistive, optical, ultrasound, piezoelectric, and thermal sensing technology.

The power source 812 can be implemented with any device capable of providing energy to the optical device 800. For example, the power source 812 may be one or more batteries or rechargeable batteries. Additionally or alternatively, the power source 812 can be a power connector or power cord that connects the optical device 800 to another power source, such as a wall outlet.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An optical device, comprising:
   a first substrate defining:
     a surface; and
     a trench forming a depression along a portion of the surface;
   a second substrate coupled with the surface and extending from the surface to form a raised portion around the trench;
   a laser die positioned within the trench, such that the laser die is surrounded by the second substrate;
   an optical material positioned within a region between the laser die, the first substrate, and the second substrate, the optical material comprising at least one of a liquid material or a solid material; and
   a third substrate coupled with the second substrate such that the second substrate is positioned between the first substrate and the third substrate; wherein:

the second substrate is configured to at least partially isolate the laser die from mechanical stress exerted on the optical device.

2. The optical device of claim 1, further comprising:

an optical output;

an underfill material positioned between the first substrate and the second substrate; and a fill dam configured to retain the underfill material such that it does not cover the optical output.

3. The optical device of claim 1, wherein the third substrate defines a fill dam coupled to or extending toward the first substrate.

4. The optical device of claim 3, wherein a bottom edge of the fill dam is offset from the first substrate.

5. The optical device of claim 3, wherein the fill dam is configured to retain a fill material within a space between the first substrate and the third substrate.

6. The optical device of claim 1, further comprising an interconnect formed from an electrically conductive material and positioned on the third substrate.

7. The optical device of claim 6, wherein:

the third substrate comprises a first surface that faces toward the first substrate and a second surface opposite the first surface; and the interconnect is positioned on the second surface.

8. The optical device of claim 6, wherein the interconnect is electrically coupled to the laser die.

* * * * *